(12) United States Patent
Klaka et al.

(10) Patent No.: US 9,000,827 B2
(45) Date of Patent: Apr. 7, 2015

(54) SYSTEM AND METHOD FOR CONTROLLING AT LEAST TWO POWER SEMICONDUCTORS CONNECTED IN PARALLEL

(75) Inventors: Sven Klaka, Habsburg (CH); Samuel Hartmann, Dottikon (CH)

(73) Assignee: ABB Technology AB, Zurich (CH)

( * ) Notice: Subject to any disclaimer, the term of this patent is extended or adjusted under 35 U.S.C. 154(b) by 301 days.

(21) Appl. No.: 13/512,041

(22) PCT Filed: Dec. 1, 2010

(86) PCT No.: PCT/EP2010/068637
§ 371 (c)(1),
(2), (4) Date: Jun. 27, 2012

(87) PCT Pub. No.: WO2011/067288
PCT Pub. Date: Jun. 9, 2011

(65) Prior Publication Data
US 2012/0262218 A1 Oct. 18, 2012

(30) Foreign Application Priority Data
Dec. 3, 2009 (EP) .................................... 09177863

(51) Int. Cl.
*H03K 17/06* (2006.01)
*H03K 17/12* (2006.01)

(52) U.S. Cl.
CPC .............. *H03K 17/127* (2013.01); *H03K 17/06* (2013.01)

(58) Field of Classification Search
CPC ............ H02H 7/1206; H03K 17/0814; H03K 17/08148; H03K 17/0828; H03K 17/107; H03K 17/18; H03K 17/127; H03K 17/06; H01H 2085/0486
USPC ................................................ 361/56; 363/51
See application file for complete search history.

(56) References Cited

U.S. PATENT DOCUMENTS 3,191,073 A * 6/1965 Mooney .......................... 327/74
3,237,078 A * 2/1966 Rogers ........................... 320/122
(Continued)

FOREIGN PATENT DOCUMENTS

CN 1685499 A 10/2005
CN 101147307 A 3/2008
(Continued)

OTHER PUBLICATIONS

Trnaslation of—WO 200404957A1, Document reffered to as D1.*

*Primary Examiner* — Rexford Barnie
*Assistant Examiner* — Elim Ortiz
(74) *Attorney, Agent, or Firm* — Birch, Stewart, Kolasch & Birch, LLP

(57) ABSTRACT

A system includes at least two power semiconductor chips being connected in parallel and including each a gate terminal for switching the power semiconductor chip in a blocking-state by a first gate voltage and for switching the power semiconductor chip in a conducting-state by a second gate voltage. The system includes further a control device adapted for applying the first or the second gate voltage to the gate terminals of the at least two power semiconductor chips. The control device is adapted for applying a third gate voltage to the gate terminal of the at least one remaining power semiconductor chip when a power semiconductor chip fails, and that the third gate voltage is higher than the second gate voltage.

19 Claims, 5 Drawing Sheets

(56) References Cited

U.S. PATENT DOCUMENTS

Figure 1:
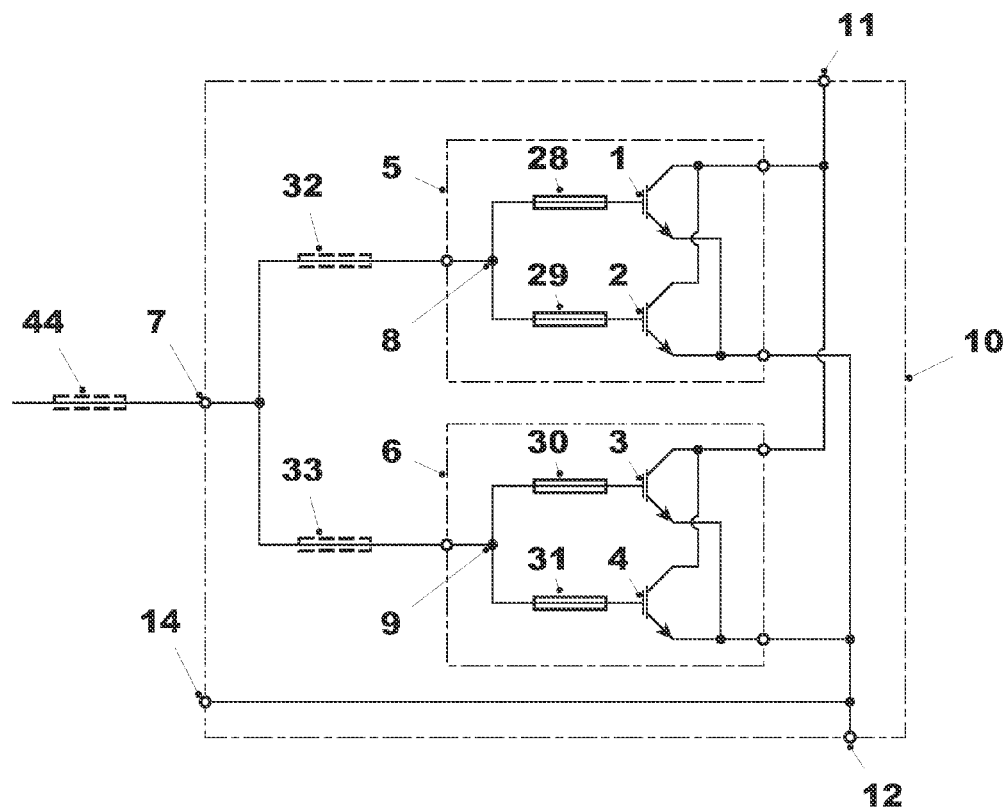

| | | | | |
|---|---|---|---|---|
| 4,698,736 | A | * | 10/1987 | Higa .............................. 363/51 |
| 4,712,153 | A | * | 12/1987 | Marget et al. ................ 361/91.6 |
| 4,719,531 | A | * | 1/1988 | Okado et al. .................... 361/86 |
| 5,757,599 | A | * | 5/1998 | Crane ............................ 361/56 |
| 2006/0118816 | A1 | | 6/2006 | Gunturi et al. |
| 2007/0262377 | A1 | * | 11/2007 | Asa .............................. 257/345 |
| 2008/0151451 | A1 | * | 6/2008 | Kilroy et al. .................... 361/86 |
| 2011/0103108 | A1 | | 5/2011 | Nee |
| 2012/0262218 | A1 | * | 10/2012 | Klaka et al. ................... 327/383 |

FOREIGN PATENT DOCUMENTS

| | | |
|---|---|---|
| EP | 0 785 625 A2 | 7/1997 |
| WO | WO 2004/049571 A1 | 6/2004 |
| WO | WO 2004049571 A1 * | 6/2004 ............ H03K 17/10 |

* cited by examiner

SYSTEM AND METHOD FOR CONTROLLING AT LEAST TWO POWER SEMICONDUCTORS CONNECTED IN PARALLEL

The invention refers to a system and method for controlling at least two power semiconductor chips.

Power semiconductor chips like insulated gate bipolar transistors (IGBTs) can switch only a voltage of some kV. Therefore, a plurality of power semiconductor chips are operated in series for high voltage applications like in high voltage direct current (HVDC) light substations ("HVDC light" is a registered trademark by ABB AB, Sweden). This is for example realized by a plurality of serially connected power semiconductor modules, such as press packs. Consequently, each press pack has only to switch a small portion of the total voltage depending on the number of serially connected press packs. Each press pack consists of sub modules connected in parallel and each sub module comprises at least one actively switching power semiconductor chip like an IGBT, preferably, a plurality of them. Consequently, each IGBT has only to switch a portion of the total current depending on the number of IGBTs connected in parallel. Sometimes a number of press packs connected in parallel is used instead of one press pack in the described stack of press packs. The number of parallel press packs further reduces the switching current of each press pack. Certainly, instead of press packs also normal insulated power semiconductor modules can be used.

To guarantee the operation of such a switching station constituted by the stack of press packs, each press pack has a short circuit failure mode (SCFM) capability. The press pack with SCFM capability safely goes into short circuit in case of a module failure. The short circuit generates a low ohmic connection between the emitter and the collector of the press pack, when one power semiconductor chip fails. In press packs, this is normally achieved by aluminium plates in the IGBT structure, which melt with the IGBT and form a conductive aluminium-silicon alloy. In IGBT press packs, this is usually achieved by aluminium plates in contact with the IGBT or a diode chip which in case of a failure melt with the chip and form a conductive aluminium-silicon alloy. Unfortunately, the alloy decomposes with time and the period of time for which the alloy provides a low ohmic connection is shorter than the targeted maintenance interval of a typical HVDC light substation. When the life time of the low ohmic connection of the IGBT in the SCFM ends, the voltage between collector and emitter of the remaining IGBTs in the press pack or in the press packs connected in parallel increases. This causes another IGBT or diode within the press pack or the press packs connected in parallel to fail. This IGBT will then go into SCFM, i.e. the aluminium plate of this IGBT melts with the chip and also this IGBT goes into a low ohmic state. This is called SCFM transition and the total SCFM life time of the press pack or press packs connected in parallel is high enough to survive until the next maintenance. However, at the end of the life time of one low ohmic connection of a failed IGBT, the increased voltage can lead to arching and consequently to high energy dissipation during an SCFM transition. This is especially for IGBTs for high voltages like for 4.5 kV relevant. Thus, the SCFM transition can damage a cooler which can cause water leakage. However, water leakage must be prevented.

The objective problem of the invention to be solved is to provide a system and method to control power semiconductor chips which overcomes the drawbacks of the state of the art. The low ohmic state of the power semiconductor chips shall be extended by an improved SCFM functionality of the power semiconductor chips.

The problem is solved by a system comprising a control means and at least two power semiconductor chips according to claim 1. According to the invention, the system comprises at least two, preferably a plurality of, power semiconductor chips connected in parallel. Each actively switchable power semiconductor chip comprises a gate terminal for controlling its switching state by applying a first or a second voltage for a blocking- and a conducting-state of the chip. The system further comprises a control means for providing the gate terminals with a blocking or conducting voltage as first and second gate voltage. The control means is further adapted to detect a failure of one of the at least two power semiconductor chips and for supporting an increased third gate voltage being higher than voltages for the blocking and conducting state to the gate terminals of the remaining power semiconductor chips, when at least one failed power semiconductor chip is detected within the power semiconductor module.

The problem is also solved by the method according to claim 17. The method according to the invention is a method for controlling at least two power semiconductor chips connected in parallel. The method comprises the following steps: First the power semiconductor chips are monitored for detecting one or more failed power semiconductor chips. After the detection of at least one failed power semiconductor chip, a gate voltage being higher than the gate voltage applied for a conducting-state of the power semiconductor chips is applied to the at least one gate terminal of the at least one remaining power semiconductor chip.

When one power semiconductor chip fails, the failure of this chip is detected and a higher gate voltage is supplied to the remaining power semiconductor chips. The higher gate voltage decreases the resistance of the remaining power semiconductor chips such that the higher resistance of the failed chip or a chip after the life time of the SCFM is compensated by the remaining chips. The remaining chips become more resistant to SCFM transitions, because the remaining chips can handle the increased current load without overheating. Thus, the life time of the SCFM and the time period after which a SCFM transition occurs can be increased or the SCFM transition can be completely prevented, because the remaining IGBTs take over the current of the failed IGBT at the end of the life time of the SCFM. The higher gate voltage also allows the remaining chips a better surviving in a short circuit overload event, because the short circuit current will be reached at a lower voltage drop due to increased gate voltage. Short circuit overload events arise sometimes in switching stations and lead to sudden increase of a high currents and the switch has to be shut off immediately. By the higher gate voltage, the IGBTs being parallel to a failed IGBT can handle this short time high current events without further damages. This solution allows also the use of power semiconductor chips without any SCFM capability, if the increased third voltage is applied immediatly after the detection of the failed chip to the remaining power semiconductor chips.

The dependent claims refer to advantageous embodiments of the invention.

In one embodiment, the system comprises at least one module, in particular a plurality of modules connected in parallel, and each module comprises at least one sub module, in particular a plurality of sub modules, and each sub module comprises at least one of the at least two power semiconductor chips, in particular a plurality of power semiconductor chips.

In one embodiment, the power semiconductor module has a common gate terminal connected with the control means and with the individual gate terminals of the power semiconductor chips, directly or via common gate terminals of each sub module. In another embodiment, each sub module has a common gate terminal connected with all individual gate terminals of the power semiconductor chips in this sub module and connected with the control means directly or with the common gate terminal of the module.

In one embodiment, each connection between the gate terminal of the module and the sub module comprises an individual fuse. In another embodiment, each connection between the gate terminal of each power semiconductor chip and the gate terminal of the sub module, which comprises the chip, or the control means comprises an individual fuse. In another embodiment, each connection between the gate terminal of the module and the sub module comprises an individual fuse and the connection between the gate terminal of each sub module and each power semiconductor chip of the corresponding sub module comprises an individual fuse such that nested fuses control each chip and the sub module as units of chips. In the case of more than one module, each module can be controlled by a fuse or an additional fuse in the connection between the gate terminal of the module and the control means. The fuses cut off the gate terminal of the power semiconductor chips with gate-emitter shorts or the sub modules with gate-emitter shorts or the modules with gate emitter shorts. A gate emitter short draws high current from the gate voltage supply. Consequently, the voltage of the supply is pulled down and all remaining power semiconductor chips of the system fall into blocking mode which has to be prevented. Therefore, the fuses guarantee the gate voltage supply with the third voltage that is preferably 20 V. It is further advantageous that each fuse or the serially connected fuses has/have a resistance of a gate resistor. Thus, the gate resistor can be replaced and realized by the fuse and the control circuit of the power semiconductor module can be simplified.

In one embodiment, the gate voltage is increased over 15 V, in particular over 16 V, in particular over 17 V, in particular over 18 V, in particular over 19 V, preferably over 20 V. However, the permanent voltage applied to the gate terminals of the remaining chips should not damage the chips and should therefore, be lower than a damaging voltage. The increased third gate voltage increases the capability of surviving a short circuit overload condition. In a further embodiment, the increased third voltage is applied permanently to the chips. Normally, power semiconductor modules or chips are switched on (conductive state) and off (blocking state) by applying a first or second voltage of either 15 V or −15 V. Switching with higher gate voltages reduces conduction losses. As a consequence, thermal fatigue is lower and the life time is longer. However, if all power semiconductor chips in a stack of series connected modules or other groups of power semiconductor chips are switched on with a high gate voltage of e.g. 20 V, the current rise in case of a short circuit overload condition is too high for that the power semiconductor chips can be safely turned off. The situation is different when only applying a high gate voltage to a power module in SCFM. The loss reduction by applying the higher gate-voltage and by not switching leads to higher life time of the remaining still functional power semiconductor chips in the module. In case of a short circuit overload condition, the current rise is limited by the still intact modules connected in series with the module being in SCFM mode in the stack and being in on-state with typically only 15 V gate voltage. The module in SCFM which is permanently turned on with a higher gate voltage will conduct the same current peak at a lower voltage. Therefore, the module in SCFM has high probability to survive the overload event. Consequently, the high gate voltage applied ensures a reliable low ohmic status of the module in SCFM and therefore prevents any SCFM transitions.

In one embodiment, the system comprises further a first power supply connectable with the gate terminals of the power semiconductor chips and adapted for supplying the first and second gate voltage. The system comprises further a second power supply for supplying an increased third gate voltage to the gate terminals of those power semiconductor chips being not in a failure mode. The second power supply can be connected e.g. to the common gate terminal of the power semiconductor module by a switching means. The switching means is suitable for connecting either the first or second power supply to the gate terminals of the power semiconductor chips e.g. over the common gate terminal of the power semiconductor module. The switching means is connected to the control means for controlling of the switching state and the control means is suitable to connect the gate terminals of the power semiconductor chips with the first power supply in a failure switching state, when a failure in one of the power semiconductor chips occurs.

In one embodiment, the second power supply comprises one of or a combination of a battery, a current transformer transforming the power semiconductor current, a voltage transformer for transforming a collector-emitter-voltage of the power semiconductor module being in the failure mode, a voltage transformer for transforming a collector-emitter-voltage of a neighbouring module of the module being in the failure mode, a voltage transformer for transforming a collector-emitter-voltage of a neighbouring module of the module being in the failure mode. Neighbouring means here the module or group of modules being connected in parallel which is or are arranged directly above or under module or modules in SCFM mode and is or are connected in series to the module or modules in SCFM mode. At the neighbouring module or modules is secured that the necessary voltage for the increased gate voltage of the second power supply of the module or modules in SCFM mode exists, at least if the neighbouring module or modules are not in SCFM mode. The advantages of a battery are low costs and low weight. However, a battery capacity can be exceeded if a gate leakage current just below the fuse rating lasts for a longer time. The advantage of a current transformer is a permanent voltage supply, but a current transformer with a power of 20 W is heavy and expensive. Therefore, the combination of a current transformer and a battery is especially advantageous. The current transformer can easily provide 1 W of power and the needed energy for burning the fuse can come from a battery or a large capacitor.

In one embodiment, the control means is further connected to collector sides and/or emitter sides and/or the gate terminals of the power semiconductor chips for detecting a failure mode of the power semiconductor chips and/or for transforming the voltage between collector and emitter into a suitable normal first and second gate voltage and a suitable increased third gate voltage.

The SCFM mode according to the invention of a group of power semiconductor chips connected in parallel is achieved by an increased gate voltage. However, it is still advantageous to mount the power semiconductor chips in a package such that an individual SCFM mode as described in the introduction of the state of the art is achieved. Thus, the power semiconductor chips being parallel to a failed power semiconductor chip can be switched into the SCFM mode according to the invention with ease after the failure, because the failed power semiconductor chip melts and forms a low ohmic connection to bridge the failed power semiconductor chip for a while. In an alternative embodiment, the system comprises power semiconductor chips without an arrangement that shows an individual SCFM capability like in modules being electrically insulated versus the cooling metal layer. However, the third gate voltage has to be applied immediately, i.e. after less than 10 microseconds, in particular after less than one microsecond. If one chip fails, at least one parallel sub module or at least one parallel chip can take over the current of the failed chip. To compensate the increased burden for the remaining chips due to the higher current, the remaining chips are permanently kept in an on-state (conductive state) with a lower resistance by supplying the third gate voltage to the gate terminals of the remaining power semiconductor chips. This allows the use of cheaper power semiconductor modules which are well-adapted for switching high currents. Thus, even the total number of power semiconductor chips or of power semiconductor modules can be reduced.

Figure 2:
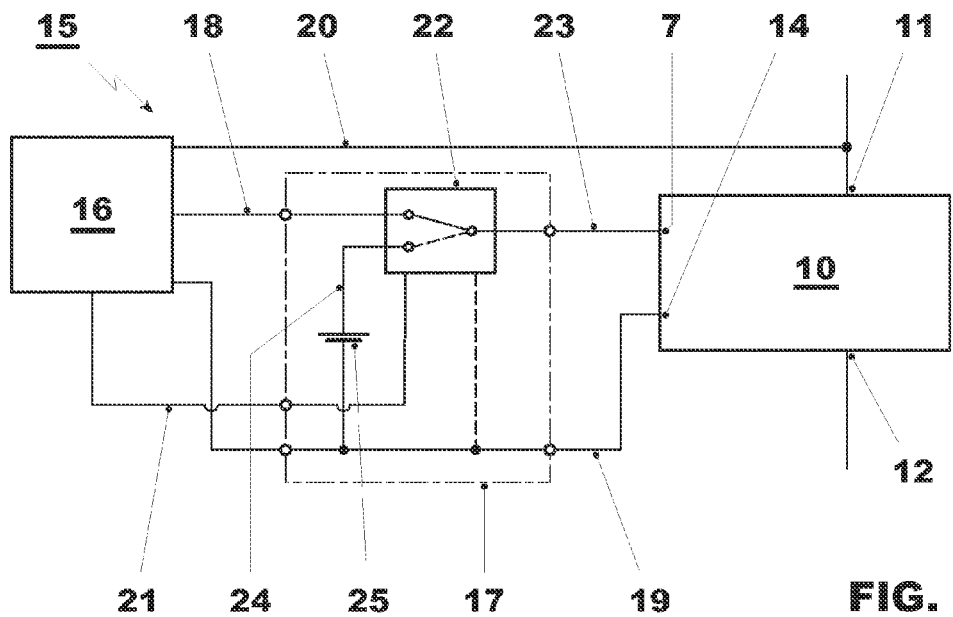
Figure 3:
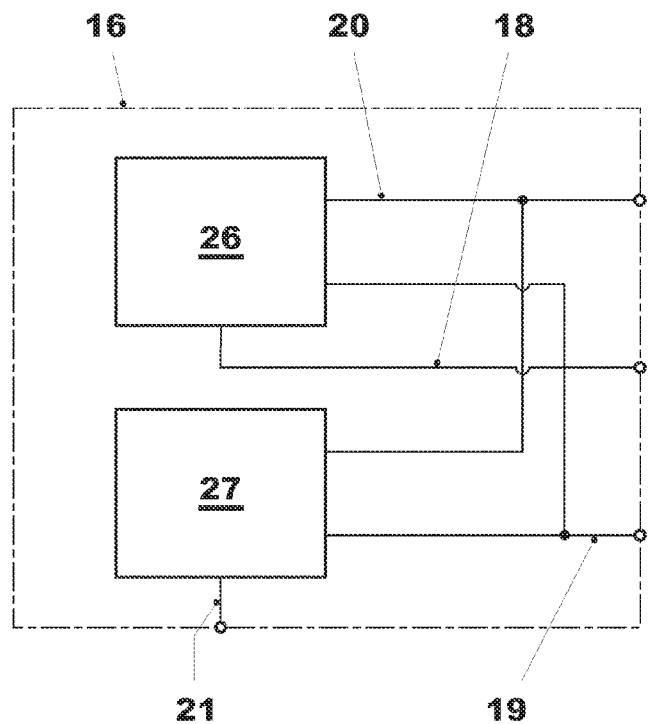
Figure 4:
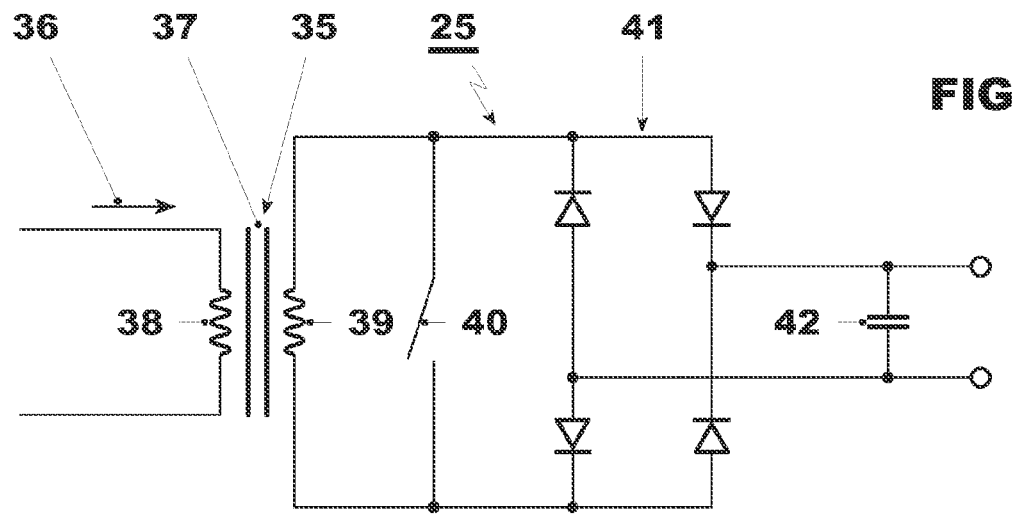
Figure 5:
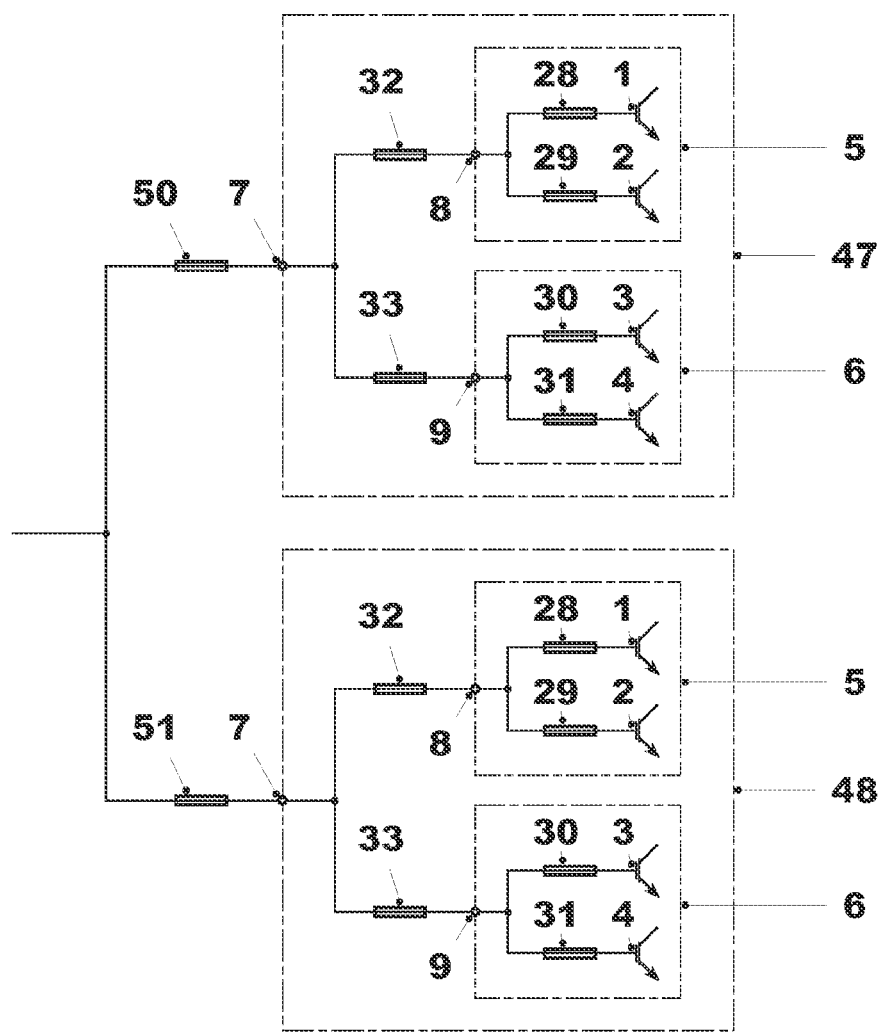
Figure 6:
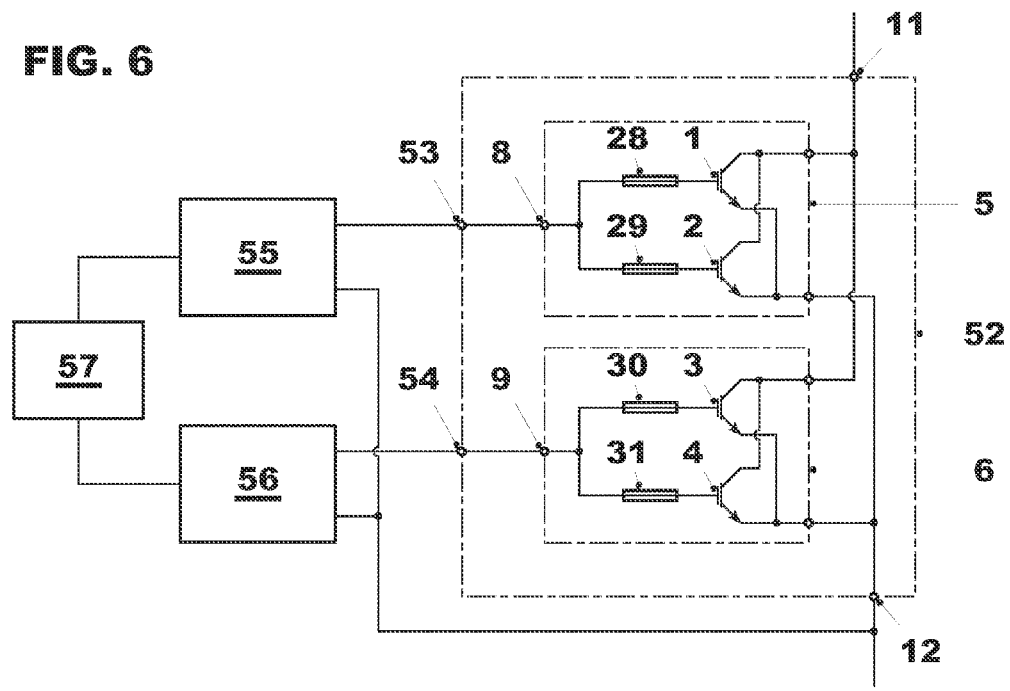
Figure 7:
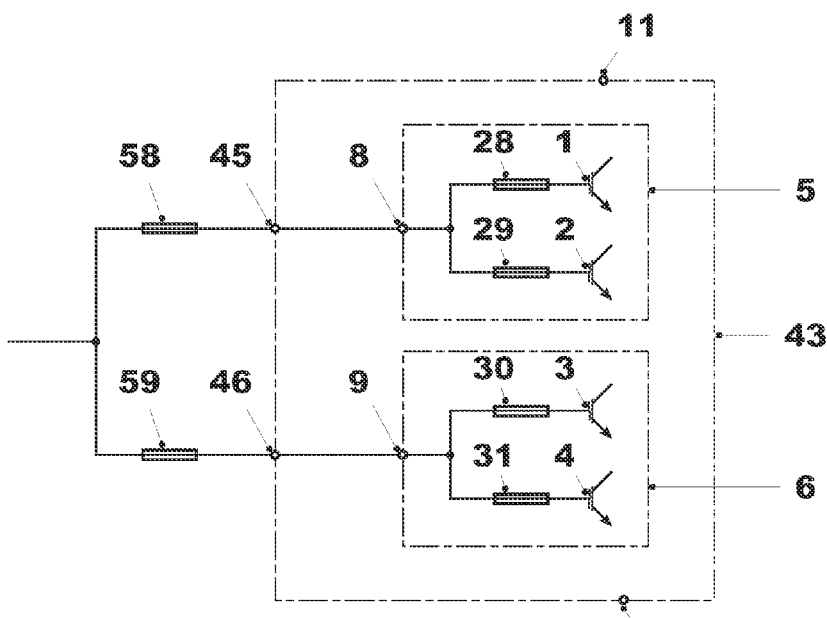
Figure 8:
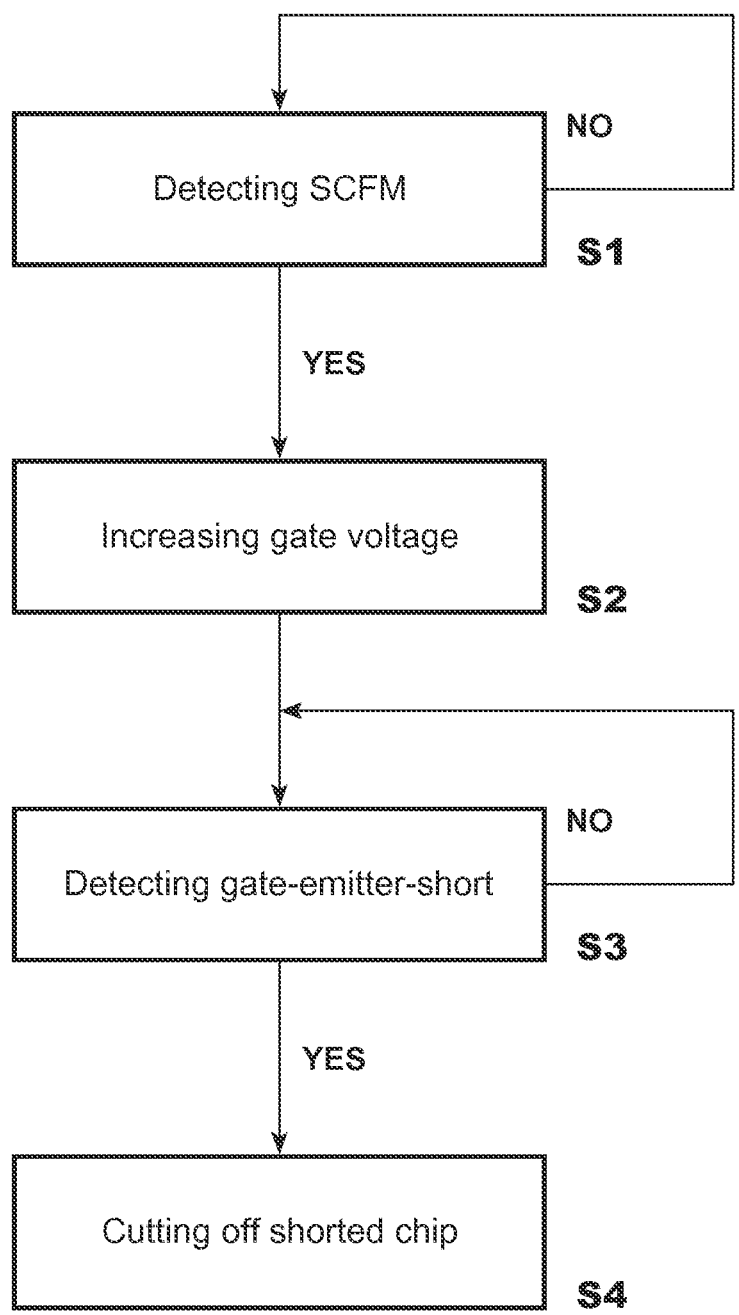

In the following, exemplary embodiments of the invention will be described with the help of the drawing. The drawing shows:

FIG. 1 a structure of a power semiconductor module according to a first embodiment of the invention;

FIG. 2 a stack element of a system for controlling power semiconductor chips according to the first embodiment of the invention;

FIG. 3 a gate unit of the stack element according to the first embodiment of the invention;

FIG. 4 an exemplary voltage supply of the system for controlling the power semiconductor chips according to the first embodiment of the invention;

FIG. 5 two parallel connected power semiconductor modules according to an alternative embodiment of the invention;

FIG. 6 a stack element according to another alternative embodiment of the invention;

FIG. 7 an alternative circuitry of the power semiconductor module according to one embodiment of the invention; and FIG. 8 a scheme of the steps of the method for controlling a power semiconductor module according to the invention.

FIG. 1 shows a schematic structure of a press pack 10 as a power semiconductor module comprising IGBTs 1, 2, 3 and 4 as actively switchable power semiconductor chips according to a first embodiment of the invention. The IGBTs 1 and 2 are arranged in a first sub module 5 and the IGBTs 3 and 4 are arranged in a second sub module 6. The sub modules 5 and 6 are preprocessed as units and can be arranged according to the requirements in an arbitrary number in a press pack 10, here two sub modules 5 and 6. Each sub module can contain an arbitrary number of electronic elements, wherein at least one power semiconductor chip for switching such as an IGBT, metal-oxide-semiconductor field-effect transistor (MOSFET), etc. is required. In the first embodiment, each sub module 5 and 6 comprises two IGBTs 1, 2 and 3, 4, respectively. However, the invention is not restricted two a plurality of switching power semiconductor chips 1, 2, 3 and 4 within each sub module 5 and 6. Each sub module 5 and 6 can also comprise only one actively switching power semiconductor chip together with other power semiconductor chips. Often a diode is circuited inversely parallel to the IGBT. The sub modules 5 and 6 can even correspond each to one switching power semiconductor chip. It is further advantageous to design each sub module 5 and 6 equally to increase the production number, to simplify the construction and to ensure that the sub modules 5 and 6 have the same functionalities.

The press pack 10 together with the control circuit not shown in FIG. 1 forms in the first embodiment of the invention a so-called stack element. A stack element is a unit of at least two, preferably a plurality of, power semiconductor chips connected in parallel like the IGBTs 1, 2, 3, 4, wherein the stack element is adapted to be connected in series with a plurality of further, preferably equal, stack elements. The stack of serially connected stack elements form a switching station as a system according to the invention for switching high voltages and high currents of HVDC light substations. In an alternative embodiment, the stack element can even comprise two or a plurality of power semiconductor modules like the press pack 10 connected in parallel.

All IGBTs 1, 2, 3, 4 in the press pack 10 are connected in parallel such that the IGBTs 1, 2, 3, 4 can divide the stack current. Therefore, the sub modules 5 and 6 are also connected in parallel. A collector terminal 11 is connected with a collector terminal of the first and second sub module 5 and 6. The collector terminal of the sub module 5 is connected with the collector terminals of the IGBTs 1 and 2. The emitter terminals of IGBTs 1 and 2 are connected to an emitter terminal of the sub module 5. The collector terminal of the sub module 6 is connected with the collector terminals of the IGBTs 3 and 4. The emitter terminals of IGBTs 3 and 4 are connected to an emitter terminal of the sub module 6. Finally, the emitter terminals of the sub modules 5 and 6 are connected to the emitter terminal 12 of the press pack 10. The power semiconductor module 10 shows even an auxiliary emitter terminal 14 to detect and use the emitter voltage potential of the press pack 10. However, in an alternative embodiment the detection and usage of the emitter and collector potential can be performed directly at the collector and emitter terminal 11 and 12 or at the auxiliary emitter terminal 14 and an additional auxiliary collector terminal or at an auxiliary collector terminal and the emitter terminal 12 with the auxiliary collector terminal instead of the auxiliary emitter terminal 14.

All gate terminals of the IGBTs 1, 2, 3 and 4 are connected to a common gate terminal 7 over the corresponding gate terminals 8 and 9 of the sub modules 5 and 6. However, the gate terminals of the IGBTs 1, 2, 3 and 4 or the gate terminals 8 and 9 of the sub modules 5 and 6 could also be led out of the press pack 10 individually. The sub modules 5 and 6 normally are prepared in housings which are arranged together in a press pack 10 including all IGBTs 1, 2, 3 and 4. The collector terminal 11 and the emitter terminal 12 of the press pack 10 is arranged at a top and a bottom side. This allows serially connecting the press packs 10 as stack elements by arranging the stack elements in a stack and by pressing the stack elements under high pressure together. Despite of preferred use of press packs 10 as power semiconductor modules, the invention is not restricted to those and even different modules could be used. Alternatively, even a wire-connection between the stack elements is also possible. A first or second gate voltage applied to the gate terminal 7 switches the press pack 10 into a conductive or blocking state between the collector and emitter terminal 11 and 12. The IGBTs 1, 2, 3 and 4 according to a first embodiment of the invention are arranged such in the press pack 10 that the IGBTs 1, 2, 3, and 4 show an individual SCFM mode such that if one IGBT 1, 2, 3 or 4 fails, the failed IGBT forms a low ohmic conductor. Such a press pack 10 with an arrangement of IGBTs 1, 2, 3 and 4 that an individual SCFM mode is achieved is sometimes also called StakPak (registered trademark) module. However, the invention is not restricted to IGBTs 1, 2, 3, 4 such an arrangement and alternative embodiments with arrangements of IGBTs without individual SCFM mode are also possible.

FIG. 2 illustrates schematically a stack element 15 according to the first embodiment of the invention. Here the stack element 15 comprises one press pack 10 and a control circuit for the IGBTs 1, 2, 3, 4 in the press pack 10. The stack element 15 comprises the press pack 10 described before as a stack element, and a gate unit 16 and a SCFM voltage supply circuit 17 as a control means. The press pack 10, the gate unit 16 and the SCFM voltage supply circuit 17 can be arranged all on one circuit board or a common housing comprises all units 10, 16 and 17 of the stack element 15 and circuits them adequately. The gate unit 16 supplies the gate terminal 7 via conductor 18 with the selected first or second gate voltage for switching the press pack 10 between on- and off-states. For the on-state, i.e. a conductive connection between the collector terminal 11 and the emitter terminal 12 of the press pack is established, normally a first gate voltage of 15 V is applied between the gate terminal 7 and the emitter terminal 12. For the off-state, normally a second gate voltage of −15 V is supplied between the gate terminal 7 and the emitter terminal 12. Therefore, the gate unit 16 is connected via conductor 19 with the auxiliary emitter terminal 14. The energy for the generation of the first and second gate voltage can be taken from the potential difference between the collector side and emitter side of the press pack 10 gripped by the collector terminal 11 and the auxiliary emitter terminal 14 and conducted to the gate unit 16 via the conductors 20 and 19.

The gate unit 16 detects by means of the auxiliary collector and emitter 14, if one or more of the IGBTs 1, 2, 3, 4 of the press pack 10 fails or fail. The detection mechanism can be sensitive to irregularities of the gate leakage current, to loss of collector-emitter voltage in blocking-state and/or to increased collector-emitter voltage in conducting-state. If a failed IGBT 1, 2, 3 or 4 is detected in the press pack 10, a trigger signal is sent over trigger conductor 21 to a switch 22 as switching means in the SCFM voltage supply circuit 17. The switch 22 is also connected to the auxiliary emitter terminal 14 of the press pack 10 as a reference potential for the trigger signal of the gate unit 16 to switch the switch 22. In a first position, the switch 22 connects the conductor 18, i.e. a first power supply 26 of the gate unit 16 for supplying first or second gate voltage for on- or off-state, with the gate terminal 7 via conductor 23. Or in a second position the switch 22 connects conductor 24 which is connected with a second power supply 25 to the gate terminal 7. The second power supply 25 is also connected to conductor 19 to apply an increased gate voltage as third gate voltage of the second power supply 25 between the gate terminal 7 and the emitter terminal 12. The increased third gate voltage of the second power supply 25 is 20 V and is higher than the normal first gate voltage of the on-state of 15 V and of the normal second gate voltage of the off-state of −15 V supplied by the first power supply. In the first embodiment, the failed IGBT melts and forms a low ohmic connection between the collector terminal 11 and the emitter terminal 12.

In an alternative embodiment, the switch 22 could be implemented such that the switch 22 remains in the first position, when at least a predetermined voltage is applied between the trigger signal of conductor 21 and the emitter potential of conductor 19. Otherwise, when the voltage difference between the trigger signal and the emitter 12 decreases under the predetermined voltage, the switch 22 falls automatically into the second position. Thus, errors in the gate unit 16 can be prevented.

FIG. 3 shows the gate unit 16 according to the first embodiment of the invention with the first power supply 26 for supplying a voltage of 15 V or −15 V as first and second gate voltage between the gate terminal 7 and the emitter terminal 12 and a detection unit 27 for detecting if one IGBT or more IGBTs of 1, 2, 3 and 4 failed. As a consequence of the failure, the respective IGBT 1, 2, 3 or 4 melts to a low ohmic state. If the detection unit 27 detects a failed IGBT 1, 2, 3 or 4 in the press pack 10, the detection unit 27 sends out a trigger signal over trigger conductor 21 to the switch 22 to change the switch 22 to the second position and thus, to increase the gate voltage to 20 V. Consequently, the press pack 10 is switched in a permanent on-state. The failed IGBT 1, 2, 3 or 4 forms a low ohmic connection and the remaining IGBTs show a reduced resistance by the increased gate voltage of 20V. Consequently, the remaining IGBTs are prepared to take over the current of the failed IGBT 1, 2, 3 or 4, when the life time of the low ohmic connection ends. This extends the time after which an SCFM transition occurs, because the remaining IGBTs heat up less with increased current of the increasing resistance of the failed IGBT 1, 2, 3 or 4 at the end of the SCFM life time. In addition, the failed IGBT 1, 2, 3 or 4 remains a longer time in the safe SCFM, because the remaining IGBTs with increased gate voltage of 20 V take over a higher current due to the reduced resistance. The switching station is designed such that a certain percentage of press packs 10 as stack elements can fail and be operated in a permanent on-state with an increased third gate voltage without overstressing the remaining press packs 10.

The invention is not restricted to the shown structure of the system 15.

FIG. 1 additionally shows fuses 28 to 31 to disconnect the gate terminal of the IGBTs 1, 2, 3 or 4 from the remaining gate terminals, in case a gate emitter short arises. The melting of a failed IGBT 1, 2, 3 or 4 could sometimes cause a gate emitter short. Gate emitter shorts draw high current from the second power supply 25, used after the detection of a failed IGBT 1, 2, 3 or 4. Consequently, the third gate voltage of second power supply 25 would drop and all IGBTs 1, 2, 3 and 4 fall into blocking mode. However, the blocking mode of the press pack 10 has to be prevented for not blocking the complete switching station of the HVDC light substation. A gate emitter short will lead to a high current flowing through the fuses connected between the IGBT 1, 2, 3 or 4 with the gate emitter short and the gate terminal 7 and the respective fuse 28 to 31 will melt.

Consequently, the gate terminal of the IGBT or IGBTs having a gate emitter short is disconnected from the gate terminal 7 by the corresponding fuse or fuses 28 to 31. In the first embodiment only one individual fuse 28 to 31 is used for each connection between the gate terminal of each IGBT 1, 2, 3, 4 and the second power supply 25 such that only the IGBTs 1, 2, 3, 4 with a gate emitter short are cut off the second power supply 25. The remaining IGBTs 1, 2, 3, 4 continue to conduct the stack current. In an exemplary case of an IGBT 1 with a gate emitter short, IGBT 1 is disconnected by the fuse 28. The fuse 28 to 31 is typically a thin wire capable of carrying the gate current during normal operation. The fuse 28 to 31 must melt below the maximum current the second power supply 25 can provide. A typical current rating for the fuses 28 to 31 could be 200 mA. Such fuses 28 to 31 are available with resistances around 1 Ohm. This resistance corresponds to the gate resistance values used on sub module level. Consequently, the gate resistances can be implemented as fuses 28 to 31 instead of resistors. The fuses 28 to 31 are advantageous arranged on chip level because there the current is lower than on sub module level and the resistance of the fuse does not disturb the gate voltage supply. The concept of melting fuses 28 to 31 is not needed if a gate-emitter short can be excluded by design. For example, a failure of an IGBT could burn away the gate wire. However, liquid and vaporized metal may be present near the gate circuit and may still cause a gate-emitter short. Furthermore, also a failure of an IGBT 1, 2, 3 or 4 which is not in SCFM could lead to a gate-emitter short.

In an alternative embodiment, additional sub module fuses 32, 33 can secure the each sub module 5 and 6 and/or additional module fuses 44 can secure each press pack 10 if more than one press pack 10 is connected in parallel in one stack element. Such an alternative embodiment of the press pack 10 is shown in FIG. 1 by dashed lines. Thus, nested fuses 28 to 33 and 44 of the individual fuses like 28 to 31 and the sub module fuses 32, 33 and/or the module fuses 44 can increase the security of the stack element of the alternative embodiment of the invention. If an individual fuse like 28 does not melt in the case of a gate emitter short of an IGBT 1 for some reason, all remaining IGBTs 2, 3, 4 of the stack element can fall into a blocking mode due to a decreasing third gate voltage. The sub module fuse 32 can be chosen such that the sub module fuse melts in the case of a gate emitter short current plus the normal gate currents of the remaining IGBTs 2, 3, 4 in the sub module 5 with the IGBT 1 with the gate emitter short. A module fuse 44 works in the same way for the complete press pack 10 with an IGBT with the gate emitter short. On the one hand, this increases the security of the inventive system by guaranteeing that the IGBT 1 with the gate emitter short is cut off. On the other hand, the separation of a complete sub module 5 or even the complete press pack 10 leads to a blocking mode of all remaining IGBT 2 or 2, 3, 4 in the sub module 5 or press pack 10 cut off the second power supply 25. Thus, the load of the remaining IGBTs 2 or 2, 3, 4 in the remaining sub modules 6 or press packs increases tremendously. Therefore, it is advantageous that the sub module fuses 32, 33 and/or the module fuses 44 melt at an higher current than the individual fuses 28 to 31 such that the common sub module fuses 32, 33 and/or module fuses 44 melt only in the extreme case, when one of the individual fuses 28 to 31 does not melt or a plurality of IGBTs 1, 2, 3, 4 of the sub module 5, 6 and/or press pack 10 show a gate emitter short. The more IGBTs are controlled by a fuse, the lower is the resistance of the fuse. Thus, the fuses 28 to 31 controlling individually each IGBT 1, 2, 3, 4 have a larger resistance than the fuses 32 and 33 controlling a sub module 5 and 6. The resistance of the fuses 32 and 33 controlling a sub module 5 and 6 are larger than the resistance of fuse 44 controlling the module 10. If fuses are arranged on more levels, like on chip- and submodule-level, on submodule- and module-level or on all levels, the sum of the resistances of the serially connected fuses should be smaller. The serially connected individual fuse 28 to 31 and sub module fuse 32, 33 and/or module fuse 44 have advantageously a common resistance of approximately 1 Ohm. Nested fuses 28 to 33 have further the advantage to cut off sub modules 5, 6 or modules, if more than one module is connected in parallel, which have a short circuit not occurring in the IGBTs 1, 2, 3, 4.

In a further alternative embodiment, instead of the fuses 28 to 31 only the sub module fuses 32 and 33 can secure the gate voltage supply from gate emitter shorts. This allows the usage of standard sub modules without changing their design by implementing fuses and reduces the number of fuses. In the case of a plurality of modules, the fuse can even be implemented only between the gate terminal of the module and the second power supply 25.

The second power supply 25 should be capable of providing a gate current of about 1A at 20 V such that the corresponding each fuse 28 to 31 melts rapidly in the case of a gate emitter short. In case, a gate emitter leakage starts slowly for an IGBT 1, the corresponding fuse 28 will not melt rapidly. Therefore, the second power supply 25 must be capable of providing the leakage current until the corresponding fuse 28 or one of the corresponding fuses 28, 32 or 44 in the alternative embodiment melts. For example, if the leakage is around 500 mA and the fuse rating is 200 mA, it may take several minutes until the fuse melts. Therefore, a typical permanent output current for the gate voltage supply 25 could be around 1 A. The power needed is 20 W.

FIG. 4 shows the second power supply 25 according to the first embodiment of the invention. The power can be drawn from the module current between the collector 11 and the emitter 12 of the press pack 10. That means the second power supply 25 is realized as a current transformer 35 for transforming the current 36 flowing from the collector 11 to emitter 12 of the press pack 10. The current transformer 35 is realized by two coils 38 and 39 around a magnetic core 37 such that through the coil 39 flows a current of 1 A. Therefore, the press pack 10 is surrounded by a magnetic core 37 of around 1 cm² cross section area. A copper wire is wound e.g. 1000 times around the magnetic core and forms the second coil 39. The press pack 10 conducting the stack current 36 through the center of the magnetic core 37 forms a coil with one winding.

Both sides of the coil 39 are connected to a rectifier 41 consisting here of four diodes. The output of the rectifier 41 is used as voltage of the second power supply 25 and is connected to a capacitor 42 for storing the transformed energy. Both sides of the coil 39 could be short-circuited by a switch 40. If the switch 40 is open, the capacitor 42 is charged and if the switch 40 is closed, the shorted coil 39 does not draw any power from the stack current 36.

In order to have enough magnetic field energy that can be transferred to the second power supply 25, a magnetic core 37 is needed around the module 10 in a surface being orthogonal to the direction of the current flowing through the press pack 10. In the case of the switch formed of stacked press packs 10 as stack elements, the surface is orthogonal to the stacking direction. The size of the magnetic core 37 required to supply enough power from the module current 36 as second power supply 25 can be calculated and/or simulated. The magnetic core 37 is formed as a toroid around module stack. The needed power of 20 W is reached for an operating magnetic field of 1 T, for a magnetic permeability of iron of $\mu_r$=4000 and a switching frequency of 100 Hz with a cross sectional area of the toroid of A=16 cm². Consequently, an iron volume of around 2 dm³ is needed which weights 16 kg. Thus, the third gate voltage supply by the second power supply 25 is possible, but causes a serious mechanical burden for the switching stack, since each stack element requires such a current transformer.

The needed amount of magnetic material may be reduced by one of or a combination of the following methods. The magnetic core can be operated at high flux, e.g. in saturation at 1.5 T. The closer the magnetic core is arranged to the winding, i.e. to the stack current, the larger is the magnetic flux in the magnetic core. A magnetic material with high saturation and low permeability can be used instead of iron. The needed power of the second power supply 25 can be reduced by having fuses rated at lowest possible current. It can also be assured by design that gate-emitter leakage leads to a fast current rise. A fast current rise needed to burn the fuses can come from a capacitor like capacitor 42. The switching frequency can be increased for melting the fuse or one of the nested fuses rapidly.

It is also advantageous to reduce the number of turns of the coil 39 around the magnetic core 37 on the secondary side. Consequently, the secondary current for charging the capacitor 42 will be higher. Due to the limited magnetic energy in the core, the secondary current will fall more rapidly and diminish or almost diminish before the next switching event on the primary side, i.e. before the magnetic core is charged again by the switching event on the primary side.

Alternatively, the voltage of the second power supply 25 is drawn from the voltage potential difference between the collector 11 and emitter 12 of the press pack 10 being in SCFM. However, this potential difference is very small. Consequently, a voltage between the collector 11 and the emitter 12 has to be transformed to a voltage of 20 V for use as second power supply 25. The voltage converter has the drawback that it needs to be protected against high voltage. An alternative solution for the use of more than one press pack 10 in a stack element would be to use the voltage difference of a press pack neighbouring press pack 10 and not having a failed IGBT. However, if even the neighbouring press pack fails, the power supply is not guaranteed. A battery is fourth solution for a second power supply 25. The battery has the advantage of low cost and low weight, but the battery capacity could be exceeded if a gate leakage current just below the fuse rating lasts for a longer time.

In another embodiment, two modes of power supply as presented are combined to combine their advantages. In one embodiment, a current transformer can easily provide 1 W of power for keeping the permanent gate voltage of 20 V and the energy required for burning the fuse can come from a battery or a large capacitor. This reduces the mechanical burden of the stack and allows enough power for a limited time to burn rapidly the relevant fuse 28 of the failed IGBT 1.

In general, the gate terminals of all IGBTs like 1, 2, 3, 4 connected in parallel in a stack element comprising an arbitrary number of power semiconductor modules, an arbitrary number of sub modules and at least the number of IGBTs as sub modules can be provided from the same first and second power supply 26 and 25. The first and second power supply and the control circuit as shown in FIG. 2 is advantageously integrated in the stack element 15, in the first embodiment of the invention, the first and second power supply 26 and 25 can even be integrated directly in the press pack 10. In the case of more press packs 10, a common control circuit as shown in FIG. 2 can be realized in the stack element for all press packs 10 in the stack element.

FIG. 5 shows the arrangement of two press packs 47 and 48 in a stack element 49 of an alternative embodiment of the invention. The control circuit not shown in FIG. 5 is equal to the control circuit shown in the stack element 15 in FIG. 2. The press packs 47 and 48 are designed almost equal to the press pack 10 presented in FIG. 1. Therefore, the reference signs of press pack 10 are used for equal parts also for the press packs 47 and 48. The parallel connection of the IGBTs 1, 2, 3, 4 and of the sub modules 5 and 6 is not explicitly shown, but is equal to that of press pack 10. In contrast to press pack 10, the sub modules 5 and 6 have common sub module fuses 32 and 33. In addition, each press pack 47 and 48 has a module fuse 50 and 51. Instead of the control circuit of the stack element 15, different power supplies can be used for different press packs 47 and 48. That means that a first and second power supply are directly connectable with the gate terminal 7 of the press pack 47 and a third and fourth power supply are directly connectable with the gate terminal 7 of the press pack 48. Thus, the fuses 50 and 51 are not necessary any more, since a press pack 47 with a gate emitter short does not draw any current of the third and especially of the fourth power supply. In such a design, the control circuit can be integrated in the power semiconductor module.

FIG. 6 shows an alternative press pack 52 of an alternative embodiment of the invention which is designed almost equal to the press pack 10 presented in FIG. 1. Therefore, the reference signs of press pack 10 are used for equal parts also for the press pack 52. In contrast to press pack 10, press pack 52 leads the terminals 8 and 9 of the sub modules 5 and 6 directly to the module terminals 53 and 54 connected with the terminals 8 and 9. In the alternative embodiment, the terminal 53 is connected with a first sub module power supply 55 and the terminal 54 is connected with a second sub module power supply 56. Both sub module power supplies 55 and 56 are connected to the emitter terminal 12 to apply a gate voltage between the gate terminals of the IGBTs of the sub modules 5 and 6 and the emitter terminal 12. The first and second sub module power supplies 55 and 56 are adapted to give a three different gate voltages: A first gate voltage of a blocking state of −15 V, a second gate voltage of a conducting state of 15 V and a third gate voltage of 20 V, when one of the IGBTs 1, 2, 3, 4 in one of the sub modules 5 and 6 fails. A common control unit 57 is connected with each of the power supplies 55 and 56. The control unit 57 comprises a detection circuit for detecting a failed IGBT 1, 2, 3 or 4 in the press pack 52. If one failed IGBT 1, 2, 3, 4 is detected, both power supplies 55 and 56 are controlled by the control 57 such that the third gate voltage is applied between the gate terminals of the IGBTs 1, 2, 3, 4 and the emitter terminal 12. Thus, the control means is formed in this embodiment by the first and second sub module power supplies 55,56 and the control unit 57. The gate voltage supply of the IGBTs 1, 2, 3, 4 of the single sub modules 5 and 6 is advantageous, because a gate emitter short in the sub module 5 cannot draw any current from the independent second sub module power supply 56. Thus, the sub module fuses 32 and 33 are not necessary any more. Such an independent gate voltage supply for each sub module increases the reliability of system, because the operation of the system does not depend on the melting of one fuse 28 to 31. In one embodiment, the voltage supply 55, 56 responsible for one sub module 5, 6 can be integrated in the sub module 5, 6. Such independent power supplies can even be used for each module or each sub module of a plurality of modules.

In another embodiment, the fuses 32 and 33 of press pack 10 are arranged outside of the press pack 43 as sub module fuses 58 and 59 as shown in FIG. 7. The press pack 43 is designed as shown in FIG. 1, except that the gate terminals 8 and 9 of each sub module 5 and 6 are connected with gate terminals 45 and 46 of the press pack 43. Thus, the press pack 43 has a number of gate terminals 45 and 46 which correspond to the number of sub modules 5 and 6. A circuitry connects the gate terminals 44 and 45 each with a fuse 58 and 59 corresponding to the fuses 32 and 33.

In a second embodiment, a system is realized as in the first embodiment or as in one of the alternative embodiments. The second embodiment differs to the ones described before that it uses insulated power modules instead of press packs. Insulated power modules have power semiconductor chips like IGBTs which are electrically insulated by an insulating substrate layer to a cooling metal layer. Such an arrangement is cheaper in production. However, the package do not provide an individual SCFM mode for the IGBTs. Several standard insulated IGBT modules like the HiPak (registered trademark) module can be used as module as described to build a stack element. In addition, these arrangement of the IGBTs is well-suited for switching high voltages. However, they have the drawback to explode when they fail. Therefore, a security wall as explosion protection is arranged between each IGBT and/or each sub module and/or each module to protect the neighbouring IGBTs, sub modules and/or modules when one sub module fails and explode. The remaining IGBTs are connected through by a permanent increased third gate voltage of 20 V supplied by a circuitry as for the press pack 10 in the first embodiment shown in FIG. 3. Thus, the remaining sub modules can handle the higher current after the failure of one sub module by the higher gate voltage without destroying the remaining sub modules. The increased gate voltage has to be applied to the gate terminals of the IGBTs of the remaining sub modules within microseconds to prevent that the suddenly blocking IGBT due to the failure destroys the remaining IGBTs that have to handle the additional current of the failed IGBT. Thus, the invention overcomes the usage of IGBT modules with SCFM capabilities.

FIG. 8 shows a flow chart with the steps of the method for controlling a power semiconductor module 10 as described before. In a first step S1, the gate unit 16 checks if a SCFM occurred in one of the IGBTs 1, 2, 3, 4 of the module 10 until a detection result is positive. After a failed IGBT 1, 2, 3 or 4 is detected, in a second step S2, the gate voltage of the gate terminals of the IGBTs being not in a failure mode, in the example of before 2, 3 and 4, is increased to 20 V. Certainly, this includes the possibility as described in the first embodiment of the invention to increase the gate voltage of all IGBTs 1, 2, 3, 4 of the stack element by a common gate conductor, even the gate voltage of the failed IGBT 1. The increased gate voltage is provided as described before by switching from the first power supply 26 to a second power supply 25 or by switching a common power supply able to provide 3 gate voltages to a third gate voltage of 20 V. In a third step S3, it is checked if the gate current of one of the IGBTs 1, 2, 3, 4 especially of the failed one exceeds a threshold. The threshold defines a current which is high enough to decrease the gate voltage of 20 V of the second power supply 25. If the current of one IGBT 1, 2, 3, 4 increases over this threshold, in a fourth step S4, the IGBT with this gate-emitter short is cut off by a fuse. In the case of fuses, the connection is automatically cut off by the melted fuse, when the current exceeds the threshold.

The invention is not restricted to the described embodiments. All embodiments of the invention can be advantageously combined.

The invention claimed is:

1. A system comprising:
   at least two power semiconductor chips being connected in parallel and comprising each a gate terminal for switching the power semiconductor chip in a blocking-state by a first gate voltage and for switching the power semiconductor chip in a conducting-state by a second gate voltage; and
   a control device adapted to apply the first or the second gate voltage to the gate terminals of the at least two power semiconductor chips and adapted to detect a failure of one of the at least two power semiconductor chips, wherein
   the control device is adapted to apply, when a power semiconductor chip of the at least two power semiconductor chips fails and enters a short circuit failure mode, SCFM, a third gate voltage to the gate terminal of the at least one remaining power semiconductor chip, and in that the third gate voltage is higher than the second gate voltage, and
   the third gate voltage is applied permanently to the gate terminal of the at least one remaining power semiconductor chip when a power semiconductor chip fails.

2. The system according to claim 1, wherein
   the system comprises at least one module, each module comprises at least one sub module and each sub module comprises at least one of the at least two power semiconductor chips.

3. The system according to claim 2, wherein
   each sub module comprises a gate terminal connected to the control device and to each gate terminal of the at least one power semiconductor chip of the sub module and that each connection between the control device and the gate terminal of the sub module comprises an individual fuse.

4. The system according to claim 2, wherein
   each of the modules comprises a gate terminal connected to the control device and to the gate terminal of each power semiconductor chip and that each connection between the control device and the gate terminal of the module comprises an individual fuse.

5. The system according to claim 2, wherein
   each connection between the control unit and the gate terminal of each power semiconductor chip comprises an individual fuse.

6. The system according to claim 3, wherein
   each fuse or all serially connected fuses together has/have a resistance of a gate resistance and serve as gate resistor.

7. The system according to claim 3, wherein
   each of the modules comprises a gate terminal connected to the control device and to the gate terminal of each power semiconductor chip and that each connection between the control device and the gate terminal of the module comprises an individual fuse.

8. The system according to claim 1, wherein
   each connection between the control unit and the gate terminal of each power semiconductor chip comprises an individual fuse.

9. The system according to claim 1, wherein
   the control device is connected to collector sides and/or emitter sides and/or the gate terminals of the at least two power semiconductor chips for detecting a failed power semiconductor chip and/or for transforming the voltage or current of the power semiconductor unit to a first, second and/or third gate voltage of the first and/or second power supply.

10. The system according to claim 1, wherein
    the system comprises at least one module, each module comprises at least one sub module and each sub module comprises at least one of the at least two power semiconductor chips and that each power semiconductor chip and/or each sub module and/or module are separated by walls resistant against explosion of power semiconductor chips.

11. The system according to claim 10, wherein
    the at least two power semiconductor chips and/or the at least one sub module and/or the at least one module are electrically insulated versus a cooling metal layer by an insulating substrate layer.

12. The system according to claim 1, wherein
    the at least two power semiconductor chips are insulated gate bipolar transistors.

13. The system according to claim 1, wherein
    the third gate voltage exceeds 15 V.

14. A system comprising:
    at least two power semiconductor chips being connected in parallel and comprising each a gate terminal for switching the power semiconductor chip in a blocking-state by a first gate voltage and for switching the power semiconductor chip in a conducting-state by a second gate voltage; and
    a control device adapted to apply the first or the second gate voltage to the gate terminals of the at least two power semiconductor chips and adapted to detect a failure of one of the at least two power semiconductor chips, wherein the control device is adapted to apply, when a power semiconductor chip of the at least two power semiconductor chips fails and enters a short circuit failure mode, SCFM, a third gate voltage to the gate terminal of the at least one remaining power semiconductor chip, and in that the third gate voltage is higher than the second gate voltage, and the control device comprises a first power supply for supplying the first and second gate voltage and a second power supply connectable with the gate terminals of the at least two power semiconductor chips for supplying the third gate voltage.

15. The system according to claim 14, wherein
the control device comprises a switching device for connecting either the first power supply or the second power supply with the gate terminals of the at least two power semiconductor chips.

16. The system according to claim 15, wherein
the switching device is connected to a detection unit for controlling the switching state of the switching device, and in that the control device is adapted to connect the gate terminals of the power semiconductor chips with the second power supply, when a failure in one of the power semiconductor chips occurs.

17. The system according to claim 14, wherein
the second power supply comprises one of a battery, a capacitor, a current transformer transforming the current of the power semiconductor chips and a voltage transformer for transforming a collector-emitter-voltage of the power semiconductor chips, or a combination thereof.

18. A method for operating at least two power semiconductor chips connected in parallel and each power semiconductor chip comprising a gate terminal, the method comprising the steps of:

detecting a failed power semiconductor chip;

supplying a gate voltage being higher than the gate voltage applied for conducting-state of the at least two power semiconductor chips to the gate terminal of the at least one remaining power semiconductor chip, when a failed power semiconductor chip, which enters a short circuit failure mode, SCFM, is detected, wherein the gate voltage being higher than the gate voltage applied for conducting-state of the at least two power semiconductor chips is applied permanently to the gate terminal of the at least one remaining power semiconductor chip when the failed power semiconductor chip is detected.

19. The method according to claim 18, wherein
a connection to a gate terminal of a power semiconductor chip is cut off, when the current in this connection exceeds a threshold.

* * * * *

UNITED STATES PATENT AND TRADEMARK OFFICE
CERTIFICATE OF CORRECTION

PATENT NO.        : 9,000,827 B2
APPLICATION NO.   : 13/512041
DATED             : April 7, 2015
INVENTOR(S)       : Sven Klaka et al.

It is certified that error appears in the above-identified patent and that said Letters Patent is hereby corrected as shown below:

ON THE TITLE PAGE:

At item (73), Assignee, change "ABB Technology AB, Zurich (CH)" to --ABB Technology AG, Zurich (CH)--.

Signed and Sealed this
First Day of September, 2015

Michelle K. Lee
*Director of the United States Patent and Trademark Office*